AMPLIFIER WITH ADJUSTABLE GAIN-TEMPERATURE RESPONSE

Filed July 12, 1957 2 Sheets-Sheet 1

INVENTORS
THOMAS A. PRUGH
CHARLES W. DURIEUX

BY

W. E. Thibodeau, T. J. Lynch, F. E. McGee & J. P. Edgerton

AMPLIFIER WITH ADJUSTABLE GAIN-TEMPERATURE RESPONSE

Filed July 12, 1957 2 Sheets-Sheet 2

INVENTORS
THOMAS A. PRUGH
CHARLES W. DURIEUX

BY
W. E. Thibodeau, T. J. Lynch, F. E. McGee & J. D. Edgerton

United States Patent Office 2,920,278

Patented Jan. 5, 1960

2,920,278

AMPLIFIER WITH ADJUSTABLE GAIN-TEMPERATURE RESPONSE

Thomas A. Prugh, Silver Spring, Md., and Charles W. Durieux, Boston, Mass., assignors to the United States of America as represented by the Secretary of the Army Application July 12, 1957, Serial No. 671,678

3 Claims. (Cl. 330—23)

(Granted under Title 35, U.S. Code (1952), sec. 266)

The invention described herein may be manufactured and used by or for the Government for governmental purposes without the payment to us of any royalty thereon.

Our invention relates to amplifiers in general and more particularly to means and methods for choosing and adjusting the amplification-temperature response of an amplifier. The amplification-temperature response of an amplifier is the relation between amplier amplification and temperature.

It would be highly desirable in many applications to be able to choose or adjust the amplification-temperature response of an amplifier. For example, the amplification-temperature response of an amplifier may be chosen to compensate for the undesirable temperature response of a previous stage, may be chosen to prepare a signal for application to a stage having an undesirable temperature response or, if so desired, may be chosen to provide an amplifier having very good amplification stability over a wide temperature range.

An object of this invention is to provide means and methods for adjusting the amplification-temperature response of an amplifier.

Another object is to provide means and methods for adapting a transistor amplifier to provide an amplification which remains substantially constant with changes in temperature.

A further object is to provide a single-stage, single-transistor amplifier whose temperature response can be adjusted to provide an amplification-temperature response which rises at a predetermined rate, falls at a predetermined rate, and also can be adjusted to provide an amplification-temperature response which remains substantially constant with changes in temperature.

Still another object is to provide a single-stage, single-transistor amplifier having an amplification-temperature response such that the reciprocal of the current amplification of the amplifier has a constant temperature coefficient which can be adjusted to have a predetermined value.

Yet another object of this invention is to provide an amplifier whose temperature response can be adjusted to provide a predetermined amplification-temperature response.

An additional object is to provide a method for adjusting the temperature response of an amplifier to provide a predetermined amplification-temperature response.

Another object of this invention is to provide an amplifier whose amplification-temperature response has a minimum value at a predetermined temperature.

Yet another object is to provide a high amplification transistor amplifier having an amplification which remains substantially constant with changes in temperature.

In our invention the amplification-temperature response of an amplifier is adjusted by adjusting the proportion of the input current applied to the input of the amplifier. By proper choice of this proportion and the associated circuitry we have been able to adapt an amplifier to provide a predetermined amplification-temperature response.

The specific nature of the invention as well as other objects, uses and advantages thereof will clearly appear from the following description and from the accompanying drawing, in which.

Figures 1, 2:
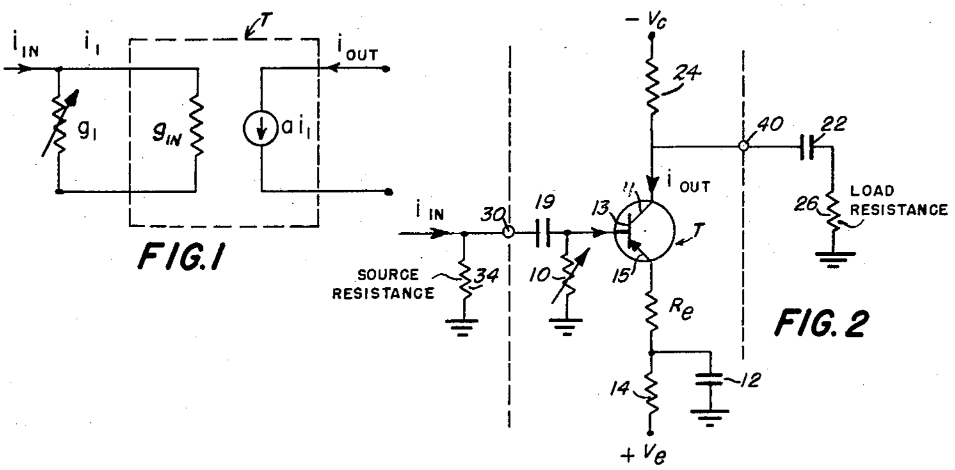
Figure 1 is a schematic diagram of a basic transistor amplifier equivalent circuit having an adjustable conductance $g_1$ connected across its input.
Figure 2 is a circuit diagram of a single-stage common emitter transistor amplifier having the equivalent circuit of Figure 1.

for several values of the input conductance $g_1$, using a 2N77 type transistor connected in the circuit of Figure 2.

Figure 5:
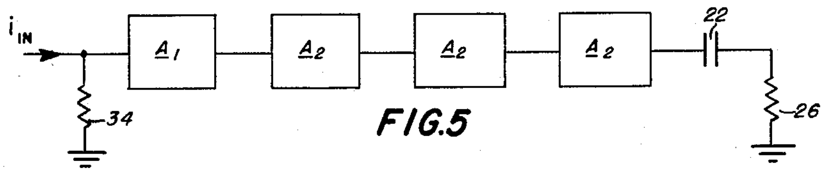

Figure 5 is a schematic diagram of four stages of Figure 2 cascaded.

Figure 6:
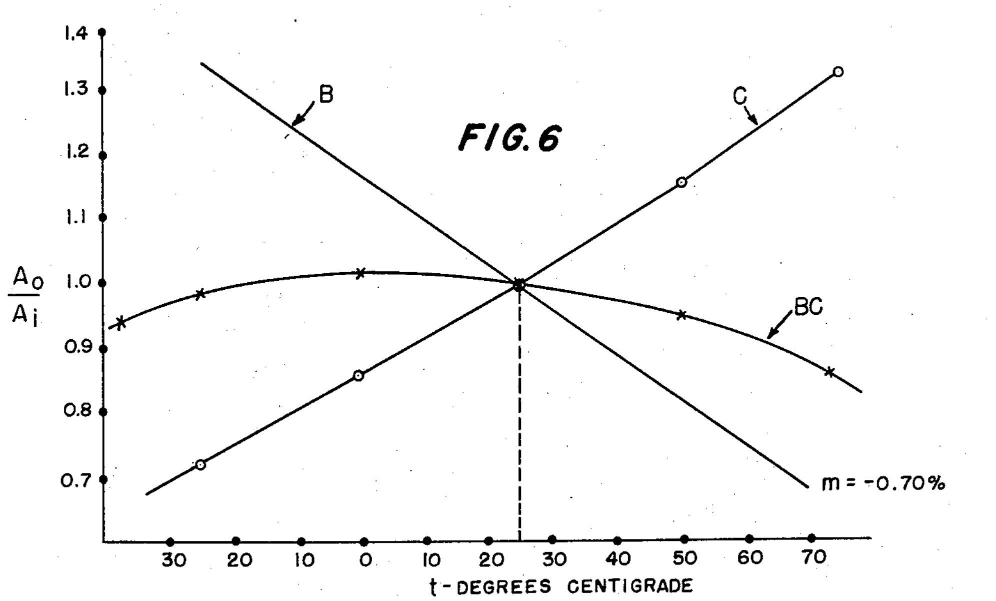

Figure 6 is a theoretical plot of $$\frac{A_0}{A_i} \text{ vs. } t$$

for the cascaded stages of Figure 5.

Figure 1 shows a basic transistor amplifier equivalent circuit having an adjustable conductance $g_1$ connected across its input. This equivalent circuit considers only low frequency (resistive) components and all coupling and bypass capacitors are assumed to have zero reactance.

The transistor T in Figure 1 is connected either common base, common emitter, or common collector. The conductance $g_{IN}$ represents the transistor input conductance and the symbol "$a$" represents the transistor current amplification for the particular connection of the transistor T. In Figure 1 "$a$" is the amplification with $g_1$ absent, that is $g_1=0$. The adjustable conductance $g_1$ represents the entire external circuit conductance to the left of the transistor T and is assumed to remain constant with changes in temperature.

We will now show how the value of the conductance $g_1$ can be adjusted to adjust the amplification-temperature response of the basic amplifier equivalent circuit of Figure 1. The current amplification $A_i$ may be written as follows:

$$A_i=\frac{i_{out}}{i_{IN}}=\frac{ai_1}{i_1+i_1\frac{g_1}{g_{IN}}}$$

$$A_i=\frac{a}{1+g_1/g_{IN}} \quad (1)$$

For most transistors $g_{IN}$ varies with changes in temperature in all transistor connections. An examination of the Equation 1 $A_i$ reveals that the effect on the current gain $A_i$ of variations in $g_{IN}$ with temperature may be adjusted by controlling the ratio $g_1/g_{IN}$. For example, if $g_1$ is made small so that $g_1/g_{IN}$ is small with respect to 1, changes in $g_{IN}$ with temperature will cause practically no change in $A_i$. If $g_1$ were zero, that is if $g_1$ were absent, the amplification-temperature response would depend only upon the temperature variations in "$a$." It becomes evident therefore that the amplification-temperature response of a transistor amplifier may be adjusted by adjusting the value of a conductance $g_1$ effectively connected across the input of the transistor amplifier.

It should be noted that an equivalent analysis could be made for a voltage source rather than a current source, with a resistor in series with $g_{IN}$ rather than in parallel as shown by $g_1$. The important feature is to provide for the adjustment of the proportion of the input signal which is applied to the amplifier.

For most transistors the transistor current amplification "$a$" and the transistor input conductance $g_{IN}$ fall or rise in opposite directions and thus have opposite effects on the current amplification $A_i$. It is possible therefore, by proper choice of the ratio $g_1/g_{IN}$, to adjust a transistor amplifier so that the effects of either "$a$" or $g_{IN}$ on the amplifier current amplification predominate. For example, if in a particular amplifier $g_{IN}$ has a negative temperature coefficient and "$a$" has a positive temperature coefficient, a choice of $g_1=0$ will provide a rising amplification-temperature response for the amplifier. On the other hand, a choice of $g_1/g_{IN}$ much greater than 1 will provide a falling amplification-temperature response if the temperature changes in $$1+\frac{g_1}{g_{IN}}$$

predominate over changes in "$a$." Furthermore, it becomes apparent that a value of $g_1/g_{IN}$ could be chosen in such an amplifier so that the temperature variations in "$a$" and $g_{IN}$ will combine to provide an amplification-temperature response which remains substantially constant with variations in temperature.

The above analysis may also be used for a transistor having a resistor in the common lead. In such a situation the values of $g_{IN}$ and "$a$" are merely changed to include the effects of this resistor. The preceding analysis will then apply.

The above analysis may further be extended to adjust the amplification-temperature response of any amplifier whose input conductance varies with temperature and whose output current is dependent upon the input current to the amplifier. The symbol "$a$" will then represent the current amplification of the amplifier with the conductance $g_1$ omitted, that is $g_1$ is equal to zero.

The preceding discussion shows how the amplification-temperature response of an amplifier may be adjusted when the variations in $g_{IN}$ and "$a$" with temperature are known for a particular circuit. We will now show how the above analysis can be applied to one type of transistor amplifier so that a predetermined amplification-temperature response can be provided merely by knowing the characteristics of certain transistor parameters commonly supplied by the manufacturer.

Figure 2 shows the circuit to which the above analysis is applied. A similar application can be made for other types of transistor amplifier circuits.

In Figure 2, the circuit between the dotted lines is a typical single-stage common emitter transistor amplifier having an input terminal 30 and an output terminal 40. A resistor 26 represents the load resistance of any circuit connected to the output terminal 40 and a resistor 34 represents the source resistance of a current source $i_{IN}$ flowing to the input terminal 30. The capacitor 22 serves as a D.-C. blocking capacitor.

The transistor T has its emitter 15, base 13, and collector 11 elements connected for common emitter operation. Negative current from a voltage supply $-V_c$ is applied to the collector 11 through a collector resistor 24. The emitter 15 is biased by positive current flowing from a positive voltage supply $+V_e$ through an emitter bias resistor 14 and an emitter resistor $R_e$. A bypass capacitor 12 is connected across the emitter bias resistor 14. The emitter resistor $R_e$ is included to provide degeneration if so desired. The adjustable resistor 10 connected between the base 13 and circuit ground is used to adjust the amplification-temperature response of the amplifier. A capacitor 19 in the input circuit serves as a coupling capacitor.

The circuit of Figure 2 is one of many which may be represented by the equivalent circuit of Figure 1. For the circuit of Figure 2 the adjustable conductance $g_1$ is the parallel combination of the adjustable resistor 10 and the source resistance 34; the conductance $g_{IN}$ represents the input conductance looking into the transistor T into which the current $i_1$ flows; and the symbol "$a$" represents the current gain of the transistor T taking into account the effect of the emitter resistor $R_e$.

To illustrate how a predetermined temperature response may be provided for a transistor amplifier merely by knowing the characteristics of certain transistor parameters, a theoretical expression for the amplification-temperature response of the illustrative single-stage amplifier of Figure 2 will now be derived. A similar derivation can be carried out for other types of transistor amplifier stages such as common collector or common base stages.

It will be assumed that the transistor in Figure 2 operates into a resistance which is much less than the output impedance of the transistor. This assumption is justified because a transistor amplifier ordinarily operates into a low impedance. For example, if the transistor amplifier operates into another similar transistor stage, the input resistance of that stage by itself is ordinarily sufficiently small to support the assumption. For applications where the amplifier feeds a high impedance, the applicability of this assumption can be maintained by paralleling the high input impedance with a sufficiently small resistor. In Figure 2, the load resistance 26 is chosen sufficiently small.

Using the above assumption for the transistor T in the circuit of Figure 2, the following approximate equations of the transistor current amplification "$a$" and the input conductance $g_{IN}$ in terms of $h$ parameters in the common base connection may be derived:

$$a\cong-\frac{h_f}{1+h_f} \tag{2}$$

$$g_{IN}\cong\frac{1+h_f}{h_i+R_e} \tag{3}$$

Where $h_f$=current generated at the output of the transistor T in the common base connection due to a unit current at the input (a ratio)

and $h_i$=input impedance of the transistor T in the common base connection with the output short-circuited (ohms).

Equations 2 and 3 are derived using a method based on the "indefinite admittance matrix" discussed by J. Shekel in "Matrix Representation of Transistor Circuits," I.R.E. Proc., vol. 40, pp. 1493–1497, November 1952. Equivalent forms of these equations have since been derived by others in the art and their correctness has been verified by experimentation. Substituting Equations 2 and 3 in Equation 1 gives:

$$A_i=\frac{-h_f}{(h_i+R_e)g_1+(1+h_f)} \tag{4}$$

Examination of Equation 4 shows three parameters which affect the transistor current amplification $A_i$. These parameters are $h_f$, $h_i$ and $(1+h_f)$. For presently available alloy and grown junction triode transistors, variations in $h_f$ from unit to unit or with temperature are extremely small. It can safely be assumed therefore that the numerator of the amplifier current amplification equation $A_i$ remains constant with variations in temperature. As regards the parameters $h_i$ and $(1+h_f)$ however, experiments have shown that these parameters vary considerably with temperature and in opposite directions. Furthermore, for presently available alloy and grown junction triode transistors, the variations of these parameters with temperature are approximately linear over a wide temperature range, that is they have constant temperature coefficients.

The fact that $h_i$ and $(1+h_f)$ have constant temperature coefficients is very desirable and makes possible the use of linear expressions for the variations in $h_i$ and $(1+h_f)$ with temperature in the equation for $A_i$. It is important to note however that this linearity in $h_i$ and $(1+h_f)$ is dependent upon maintaining a stable operating point which remains fixed with changes in temperature. Those in the art will be able to choose the bias resistors 14 and 24 and the bias sources $-V_c$ and $+V_e$ to provide an operating point which meets these requirements. Typical values for the temperature coefficients of a representative 2N77 type transistor at an operating point of 1 milliampere emitter current are about 0.15 ohm per degree centigrade for $h_i$ and about $-.00012$ unit per degree centigrade for $(1+h_f)$. At 25 degrees centigrade the parameter $h_i \cong 45$ ohms and the parameter $$(1+h_f) \cong 0.014$$

Assuming a stable operating point, the variations of $h_i$ and $(1+h_f)$ with changes in temperature may be expressed by the following linear relationships:

$h_i = h_{i_0} + K_1(t-t_0)$
and $(1+h_f) = (1+h_f)_0 - K_2(t-t_0)$
where $t$=temperature
$t_0$=reference temperature
$h_{i_0}$=value of $h_i$ at $t_0$
$(1+h_f)_0$=value of $(1+h_f)$ at $t_0$
$K_1$=absolute value of the temperature coefficient of $h_i$ in units of $h_i$ per degree temperature
$K_2$=absolute value of the temperature coefficient of $(1+h_f)$ in units of $(1+h_f)$ per degree temperature Substituting the above relationships in Equation 4 and rearranging results in the following expression for the current amplification $A_i$ of the transistor amplifier of Figure 1:

$$A_i = \frac{1}{\frac{1}{A_0} + \frac{1}{h_f}(K_2 - g_1K_1)(t-t_0)} \qquad (5)$$

where $$A_0 = \text{value of } A_i \text{ at } t_0 = \frac{-h_f}{g_1(h_{i_0}+R_e)+(1+h_f)_0}$$

Taking the reciprocal of Equation 5 and multiplying by $A_0$ gives:

$$\frac{A_0}{A_i} = 1 + \frac{g_1K_1 - K_2}{g_1(h_{i_0}+R_e)+(1+h_f)_0}(t-t_0) \qquad (6)$$

An examination of Equation 6 reveals that it is linear and has a slope which represents the change in $$\frac{1}{A_i}$$

per degree centigrade change in temperature from the reference temperature $t_0$; that is, the reciprocal of the current amplification of the amplifier has a constant temperature coefficient. The equation for this slope may be written as:

$$m = \frac{g_1K_1 - K_2}{g_1(h_{i_0}+R_e)+(1+h_f)_0} \times 100\% \qquad (7)$$

where $m$=percent change in $$\frac{1}{A_i}$$

per degree centigrade change in temperature from $t_0$
$m$=temperature coefficient of the amplifier.

From Equation 7 it is evident that the reciprocal of the current amplification $$\frac{1}{A_i}$$

can be adjusted to have a desired predetermined constant temperature coefficient merely by knowing the values of $h_i$ and $(1+h_f)$ and their temperature coefficients $K_1$ and $K_2$. By using a potentiometer for the input resistor 10 or the emitter resistor $R_e$ or both, the constant temperature coefficient of the amplifier can be adjusted over a wide range merely by turning a knob.

We will now illustrate how the Equations 6 and 7 can be applied to an actual transistor.

Figure 3:
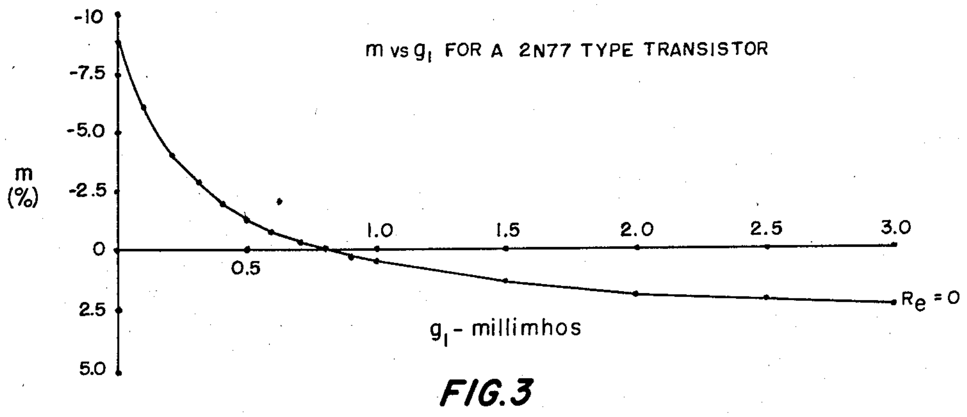
Figure 3 is a theoretical plot of the temperature coefficient $m$ vs the input conductance $g_1$, for a 2N77 type transistor connected in the circuit of Figure 1.

Figure 3 shows a theoretical curve of the temperature coefficient $m$ vs. the conductance $g_1$, for a 2N77 type transistor connected in the circuit of Figure 2. This curve is calculated using Equation 7 with the emitter resistor $R_e$ set equal to zero. For present purposes $R_e$ is set equal to zero, but for applications where degeneration is desired, $R_e$ may be chosen accordingly. The following approximate values of $h_{i_0}$, $h_f$, $(1+h_f)_0$, $K_1$ and $K_2$ are applicable to a typical 2N77 type transistor operated at 1 milliampere emitter current.

Figure 4:
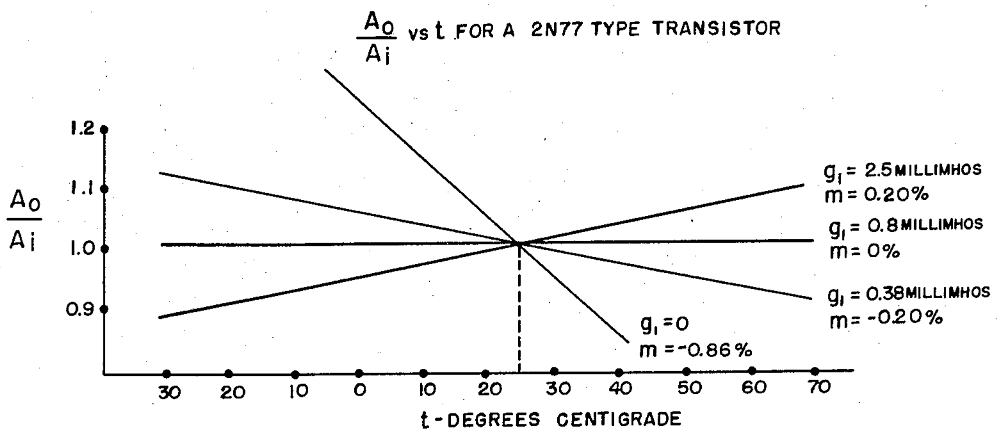
Figure 4 is a theoretical plot of $$\frac{A_0}{A_i} \text{ vs. } t$$

$h_{i_0}$=45 ohms
$h_f=-0.986$
$(1+h_f)_0=0.014$
$K_1$=0.15 ohm per degree centigrade
$K_2$=0.00012 unit per degree centigrade Figure 4 is a theoretical plot of Equation 6 for several values of the conductance $g_1$ using a 2N77 type transistor connected in the circuit of Figure 2. $R_e$ is set equal to zero. As indicated by Equation 6 the curve of $$\frac{A_0}{A_i} \text{ vs. } t$$

is a straight line having the slope $$\frac{m}{100}$$

The value of $g_1$ corresponding to the slope of each line $$\frac{m}{100}$$

is obtained from Figure 3.

Figures 3 and 4 are calculated for a single stage transistor amplifier. By cascading a number of stages an even greater variety of amplification-temperature responses can be obtained. For example, Figure 5 shows four stages cascaded, each of the stages being constructed as shown between the dotted lines in Figure 2. Assuming a 2N77 type transistor operated at 1 milliampere emitter current, the values of $R_e$ and $g_1$ of each stage are chosen to provide a slope of $m_1=-0.70$ percent for stage $A_1$ and a slope of $m_2=0.2$ percent for each of the $A_2$ stages using the derived expression for $m$. The resistor 34 represents the source resistance of the input current $i_{IN}$ and the resistor 26 represents a load resistance. A capacitor 22 is used to block D.-C. from the load resistor 26. The resistor 26 is chosen to be sufficiently small so that stage $A_2$ satisfies the basic assumption that its load resistance is much smaller than its output resistance. For the other three stages, the combination of $g_1$ and the input resistance of each subsequent stage is sufficiently small to satisfy this assumption. The conductance $g_1$ of the first stage is made up of the parallel combination of the resistor 10 of the stage $A_1$ and the source resistance 34. The conductance $g_1$ of the last three stages is made up of the parallel combination of the resistor 10 of each stage and the output resistance of the preceding stage. For practical purposes this output resistance is comprised essentially of the collector resistor 24 since the output resistance of the 2N77 type transistor will ordinarily be large in comparison.

Figure 6 shows the theoretical curves of $$\frac{A_0}{A_i} \text{ vs. } t$$

for the cascaded stages of Figure 5. Curve B is the reponse of stage $A_1$, curve C is the response of the three $A_2$ stages obtained by multiplying together the responses of each individual $A_2$ stage, and curve BC is the overall response of the four stages obtained by multiplying together line B by curve C.

From Figure 6 it becomes evident that an infinite variety of predetermined amplification-temperature responses can be obtained by the proper cascading of the amplifier stages of Figure 2. By using a potentiometer for $R_e$ or $g_1$ or both in one or more stages, a single amplifier may be used to provide a wide range of predetermined amplification - temperature responses. Those skilled in the art will understand how to choose the values of $m$ for each amplifier stage of Figure 5 so that maximum value of the curve BC occurs at almost any desired temperature. Also, if it were desired that the curve BC have a minimum value rather than a maximum value, such a minimum value could be obtained by using the four-stage transistor amplifier of Figure 5 as a feedback amplifier. Furthermore, if so desired, considerably greater variations in the shape of the amplification-temperature response curve could be obtained by cascading more stages or by using transistors whose parameters vary at a greater rate than those of the 2N77 type transistor which was used for illustrative purposes in Figure 5. Still further, even greater versatility is possible by using appropriate thermistor elements in combination with the amplifier stages. For example a thermistor element could be used for the resistor $R_e$ or the resistor 10 in Figure 2.

A particularly desirable and very important applicaiton of our invention has been to provide a high amplification transistor amplifier having very good amplification stability over a wide temperature range. The prior art has had considerable difficulty in providing such a stable amplifier. An examination of the equations for $$\frac{A_0}{A_i}$$

and $m$ reveal that the amplification of the transistor amplifier stage will remain constant with variations in temperature when:

$$K_2 = g_1 K_1 \qquad (8)$$

By cascading a number of stages, each of which satisfy Equation 8, it is possible to produce a high amplification amplifier having exceptionally good amplification stability over a wide temperature range. A specific transistor four-stage amplifier whose stages approximately satisfied Equation 8 was built and tested using stock items. Tests showed that variations in temperature from −50° C. to +75° C. caused the amplifier amplification to vary less than ±1db out of a total amplification of 80db at 25° C. This compares with a 15db variation over the same temperature range for an uncompensated transistor amplifier. By a more careful choice of transistors and component values, even this amplification stability can be improved.

It should be noted that the amplifier current amplification has been used for the derviation of the equations presented. A similar but more cumbersome analysis is possible using amplifier voltage amplification. The use of either one or the other will not be of any real importance since the amplification-temperature responses and the stage amplification will be the same no matter which one is used. It may also be noted that the actual value of the amplification was not considered. This also should cause no difficulty since those in the art will readily be able to provide any overall amplifier amplification by proper choice of $g_1$ or $R_e$ for each stage, by the use of a particular number of stages, or by using additional amplifiers.

It will be apparent that the embodiments shown are only exemplary and that various modifications can be made in construction and arrangement within the scope of the invention as defined in the appended claims.

We claim:

1. A single-stage, single-transistor, common emitter amplifier having an amplification which remains substantially constant with changes in temperature, said amplifier comprising: a transistor having emitter, base and collector elements connected for common emitter operation, said transistor having values of $h_i$ and $(1+h_f)$ which have substantially constant temperature coefficients for a fixed operating point, the temperature coefficient of $h_i$ being positive and the temperature coefficient $(1+h_f)$ being negative, $h_i$ being the input resistance of said transistor in the common base connection with the output short-circuited, and $h_f$ being the current generated at the output of said resistor in the common base connection due to a unit current at the input, means for biasing said transistor, said means maintaining a fixed operating point with changes in temperature, a load resistance connected in the collector circuit of said transistor, said load resistance having a value which is much less than the output resistance of said transistor, a resistance having a conductance $g_1$ connected effectively across the emitter and base elements of said transistor, the value of the conductance $g_1$ being chosen in accordance with the following equation:

$$g_1 = \frac{K_2}{K_1}$$

wherein $K_1$ and $K_2$ are the absolute values of the respective temperature coefficients of $h_i$ and $(1+h_f)$ in units of $h_i$ per degree temperature and units of $(1+h_f)$ per degree temperature respectively.

2. The invention in accordance with claim 1 wherein there is additionally provided a resistor in series with said emitter, the value of said resistor being chosen to provide a predetermined amount of degeneration.

3. A high amplification transistor amplifier having an amplification which remains substantially constant with variations in temperature, said amplifier comprising a plurality of cascaded stages, each stage being constructed in accordance with claim 1.

References Cited in the file of this patent

UNITED STATES PATENTS

| | | |
|---|---|---|
| 2,431,306 | Chatterjea et al. | Nov. 25, 1947 |
| 2,572,108 | Chalhoub | Oct. 23, 1951 |
| 2,680,160 | Yaeger | June 1, 1954 |
| 2,773,945 | Theriault | Dec. 11, 1956 |
| 2,808,471 | Poucel et al. | Oct. 1, 1954 |
| 2,833,870 | Wilhelmsen | May 6, 1958 |
| 2,848,564 | Keonjian | Aug. 19, 1958 |

OTHER REFERENCES

Shea: "Principle of Transistor Circuits," Sept. 15, 1953, pages 164, 165, 177–179.